(12) United States Patent
Stengel et al.

(10) Patent No.: US 6,667,659 B2
(45) Date of Patent: Dec. 23, 2003

(54) HIGH EFFICIENCY AMPLIFIER

(75) Inventors: Robert Stengel, Pompano Beach, FL (US); Bruce Thompson, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/085,544

(22) Filed: Feb. 28, 2002

(65) Prior Publication Data

US 2003/0164736 A1 Sep. 4, 2003

(51) Int. Cl.[7] ................................................ H03F 3/60

(52) U.S. Cl. ...................................... 330/286; 330/295

(58) Field of Search .......................... 330/51, 129, 286, 330/295, 136, 124 R, 84

(56) References Cited

U.S. PATENT DOCUMENTS 5,365,197 A * 11/1994 Ikalainen ..................... 330/286
5,999,057 A * 12/1999 Carlsson et al. ............. 330/279
6,433,640 B1 * 8/2002 Pavio et al. ................. 330/295

* cited by examiner

*Primary Examiner*—Henry Choe

(57) ABSTRACT

A distributed amplifier arrangement (300) is provided in which a plurality of input signals ($S_1(t), \ldots S_N(t)$) are separately controlled by a drive generator circuit (315) to produce modulation of a virtual load impedance at each amplifier stage. This permits each stage (302, 304, ... 310) of the distributed amplifier (300) to operate at maximum efficiency by permitting the stage to produce an output voltage that approaches the supply voltage. As the output power is reduced, efficiency is maintained by systematically reducing the number of stages contributing to the output to the load.

59 Claims, 7 Drawing Sheets

HIGH EFFICIENCY AMPLIFIER

FIELD OF THE INVENTION

This invention relates generally to the field of high efficiency amplifiers. Certain embodiments of this invention are more particularly related to radio frequency distributed power amplifiers with enhanced efficiency.

BACKGROUND OF THE INVENTION

In a conventional linear amplifier, DC to AC conversion efficiency is a function of output signal level relative to the DC supply voltage. Conversion efficiency decreases directly as a function of the output level, decreasing as the output signal level decreases. For battery powered devices such as radio frequency transmitters as used in cellular telephones and two-way radios, this limitation in efficiency imposes significant limitations on the battery life that can be expected for the device.

In some instances, the efficiency of a linear amplifier can be enhanced by modulating the supply voltage to the linear amplifier. In this technique, the amplifier's supply voltage is dynamically modified so that it approximately follows the envelope of the signal driving the linear amplifier. This keeps the supply voltage at or near the output voltage to enhance the amplifier's efficiency. Unfortunately, this technique cannot be universally applied to all linear amplifiers and generally requires that a DC-to-DC converter circuit be used to provide the supply voltage to the amplifier circuitry.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
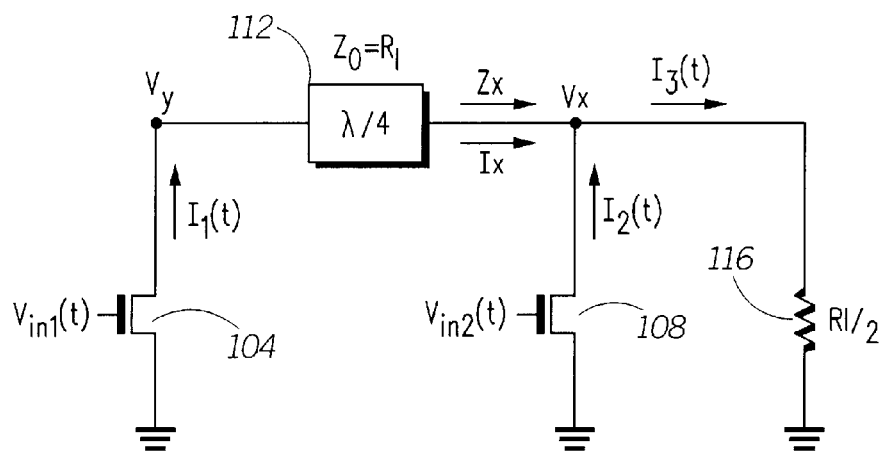
FIG. 1 is a diagram of an exemplary two-stage distributed amplifier structure consistent with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

An ideal conventional linear amplifier is designed to provide power, voltage, or current gain by reproducing the input envelope at the output with a constant multiplication factor as follows:

$$y(t) = Ax(t) \qquad \text{Equation 1}$$

Where x(t) is the input signal and y(t) is the output signal, which is a replication of the input signal in amplitude and phase. In addition, the output signal power is a function of the output voltage and load impedance by the following relation:

$$P_O = \frac{V_O^2}{2R} \qquad \text{Equation 2}$$

Where $P_O$ is the output power in watts, $V_O$ is the output voltage, and R is the output load (assumed to be real only). By use of the present invention, the output voltage peak ($V_O$) can be maintained at or close to the limit of the battery voltage over a wide range of output power levels. This maintains high conversion efficiency over the power levels where the output voltage is kept close to the battery voltage.

Reviewing the relation shown in Equation 2, there is only one variable other than the output voltage $V_O$ that can vary over the output power $P_O$ range if $V_O$ remains constant. That variable is R—the load impedance at the amplifier output terminal. Thus, if the output load can be varied as a function of the input signal amplitude, high conversion efficiency can be maintained. The present invention uses this concept and provides for modulation of the load to enhance the efficiency of the amplifier. This is very different from a conventional linear amplifier where the load remains constant over the entire range of output operating signal levels. To achieve the desired efficiency benefit without affecting the amplitude and phase information of the signal being processed, the load modulation can either be real only (no imaginary parts), or alternatively, any phase and/or amplitude load modulation can be compensated for to preserve the intended replication of the input signal at the output with increased power, voltage, and/or current. With this as a preface to some of the basic concepts of the present invention, consider an exemplary amplifier embodying concepts of the present invention.

Turning now to FIG. 1, a simple two-stage amplifier circuit arrangement 100 using a tapered distributed transmission line structure consistent with an embodiment of the present invention is illustrated. This circuit arrangement 100 uses a pair of transistors 104 and 108 separated by a quarter wavelength transmission line with characteristic impedance equal to $R_L$. The transmission line may be either a coaxial, planar, stripline, or other form of actual transmission line, or may be a lumped element approximation of a transmission line, without limitation and is designed to resonate with any parasitic reactive elements and component reactive elements to operate as a wide band transmission line impedance transformer.

In this example, the amplifier circuit 100 is designed with a structure similar to that of a two-stage distributed amplifier. However, known conventional distributed amplifiers are designed to have input signals $V_{in1}$ and $V_{in2}$ as equal signals (in magnitude) driving the two transistors 104 and 108 using a passive input network. Maximum efficiency is achieved when the two input signals drive the transistors 104 and 108 to produce maximum output to load resistor 116. When this occurs, $I_1(t)$ equals $I_2(t)$. However, as the input signal is reduced in both stages of a conventional distributed amplifier, the AC output signal decreases and the conversion efficiency drops.

In accordance with certain embodiments of the present invention, the input signals driving each stage of amplification are generated as a function of the input signal to be amplified in a manner such that they are not always equal. This permits enhanced efficiency by modulation of the load impedance seen by each stage of the amplifier. In the present example of FIG. 1, when the input signals are at their maximum values, the output signals are also at their maximum values, each device sees identical source and load impedances and the efficiency of amplifier 100 is maximized. In order to continue to achieve high efficiency, however, the amplifier 100 is provided distinctly different input signals whenever the instantaneous value of the output envelope is less than maximum in order to control the impedances seen by the transistors, as will be described.

In accordance with one embodiment using enhancement lateral double-diffused metal oxide semiconductor (LDMOS) power transistor device, as the value of $V_{in2}(t)$ is reduced from its maximum value to $V_{th}$ (linearly), the current $I_2(t)$ also reduces from its maximum value to zero by the relation:

$$I_2(t) = C_o W v_{sat}(V_{gs} - V_{th}) \quad \text{Equation 3}$$

Where $V_{th}$ = threshold voltage or turn-on voltage $$V_{th} < V_{gs} = V_{in2}(t) < V_{in2(max)} \quad \text{Equation 4}$$

and where:

$v_{sat} = 8 \times 10^6$ cm/s, the limiting velocity for electrons in silicon

W = device channel width $C_o$ = gate oxide capacitance ~ $e_{ox} e_o / t_{ox}$ $e_{ox}$ = dielectric constant of silicon = 3.9

$e_o$ = permitivity of free space $8.86 \times 10^{-14}$ F/m $t_{ox}$ = gate oxide thickness.

The value of $V_{in1}(t)$ is simultaneously reduced (linearly) from its maximum value to $V_{IN1(max)} - V_{th})/2$, so that the first stage and second stage of amplification provided by transistor 104 operates at full efficiency as the contribution of the second stage to driving the output load is tapered off. As the current $I_2(t)$ decreases from its maximum to zero, $I_1(t)$ is also reduced to a lower value. These changes in current result in the load impedance seen by transistors 104 and transistor 108 changing to maximize the amplifier's efficiency until the current $I_2(t)$ reaches zero. This is possible because the impedance seen by the drain of 104 is a function of the transmission line 112 as well as the load seen by that transmission line.

When transistor 108 is driving the load resistor 116, the impedance $Z_x$ seen at right of the transmission line 112 is given by:

$$Z_X = \frac{V_X}{I_X} \quad \text{Equation 5}$$

and is thus a function of the current flowing through transistor 108 since:

$$I_3(t) = I_x(t) + I_2(t) \quad \text{Equation 6}$$

and thus:

$$Z_X = \frac{V_X}{I_X} = \frac{(I_X + I_2)R_L}{2I_X} \quad \text{Equation 7}$$

This phenomenon of the impedance being affected by a current or voltage can be referred to as a "virtual impedance" effect.

As the current $I_2$ from transistor 108 decreases, the virtual impedance seen as a load by transistor 104 can be shown to go from $R_L$ to $2R_L$, and thus, the load on transistor 104 is modulated. The power delivered to the load resistor 116 varies from the maximum to the maximum/4 over this range. Since the voltage delivered by the first transistor 104 is to an increased virtual load impedance, efficiency remains high over the range of output voltage of the transistor 108.

Figure 2:
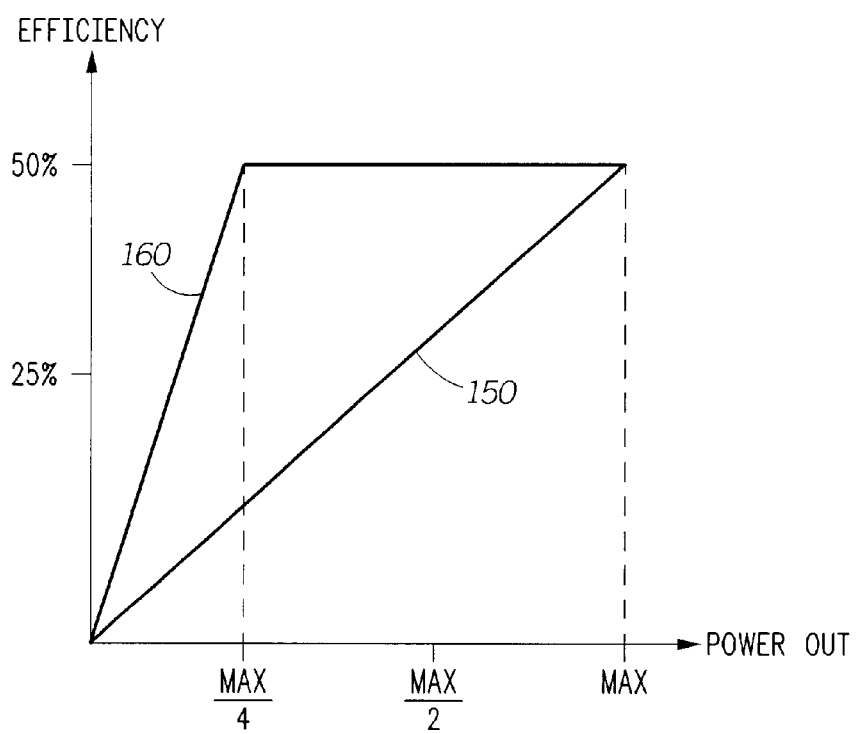
FIG. 2 is a graph depicting the conversion efficiency of the amplifier circuit 100 of FIG. 1.

Once the second stage transistor 108 is delivering zero current, it is effectively in cutoff and presents an impedance load approximating ∞. Thus, from this point downward to further reduced output signals, the amplifier 100 operates alone as a single stage transistor amplifier driving a fixed impedance load. However, over the first range described above, from maximum output power to ¼ maximum output power, the efficiency remains at or near peak efficiency. The efficiency curve of this amplifier is illustrated in the graph as curve 140 of FIG. 2. For a conventional class A amplifier, the best efficiency of 50% is only achieved at peak output power as illustrated by curve 150.

In the above two-stage amplifier 100, efficiency is retained by separately controlling the input signal delivered to the first and second stages of amplification so that as the input signal (and thus the output signal) decreases, the efficiency remains high. Although the input to the first and second stages 104 and 108 are being reduced (which would reduce the efficiency in a conventional distributed amplifier design in which both inputs were equal in magnitude), they are reduced at different rates. This results in modulation of the virtual impedance seen by the transistors throughout the circuit so that the first stage transistor 104 and the second stage transistor 108 operate at peak efficiency throughout the range of operation of the second stage transistor 108. Once the second stage of amplification is completely cut off (at ¼ output power), it ceases to drain current and contribute to decreased efficiency. Transistor 108, when cut off, also ceases to contribute to the output. Thus, the load impedance seen at the right of transmission line 112 ($Z_x$) goes from $R_L$ when transistor 108 is operating at maximum output to $R_L/2$ when transistor 108 is cut off. Since transmission line 112 is a quarter wavelength long with characteristic impedance of $R_L$, the load impedance seen by transistor 104 is transformed from $R_L$ at full maximum output to $2R_L$ when transistor 108 is cut off.

In order to achieve this efficiency in practice, the input signals $V_{in1}(t)$ and $V_{in2}(t)$ are modulated as a function of some information signal m(t) being amplified in order to produce the efficiencies described herein. The exact relationships defining the input signals needed to achieve the operation described herein are somewhat difficult to generalize since they depend somewhat upon the exact amplifier configuration and types of devices used in the distributed amplifier. For the current two-stage amplifier, the output power can be defined as the sum of the contribution of the two amplifier stages as follows:

$$P_{OUT}(t) = P_{out1}(t) + P_{out2}(t) \qquad \text{Equation 8}$$

Where $P_{out1}$ and $P_{out2}$ are the output power contributions of amplifiers 104 and 108 respectively. For this particular amplifier, using identical FETs with transconductance $g_m$ as amplifying elements, the individual output powers are given by:

$$P_{out1}(t) = g_m^2 \frac{R_L}{2} V_{IN1}^2(t) \qquad \text{Equation 9}$$

and $$P_{out2}(t) = g_m^2 \frac{R_L}{2} V_{IN2}^2(t) \qquad \text{Equation 10}$$

For maximum efficiency of operation, $V_y$ is held constant and the following relationships hold:

$$P_{out}(t) = g_m^2 \frac{R_L}{2} [5V_{IN1}^2 - 4V_{IN1}V_{INMAX} + V_{INMAX}^2] \qquad \text{Equation 11}$$

whenever the output power $P_{out}(t)$ is between the maximum output power $P_{MAX}$ and $P_{MAX}/4$; and $$P_{out}(t) = g_m^2 \frac{R_L}{2} [V_{IN1}(t)]^2 \qquad \text{Equation 12}$$

whenever the output power $P_{out}(t)$ is between $P_{MAX}/4$ and zero (i.e., when $V_{in2}(t)=0$). For this particular amplifier structure, the efficiencies described can be achieved by driving the amplifier with a pair of input voltages that are derived by setting the power output equal to a modulating signal times a gain factor for the amplifier and solving for $V_{in1}(t)$ and $V_{in2}(t)$ as a function of the modulating signal in the above equations.

Figure 3:
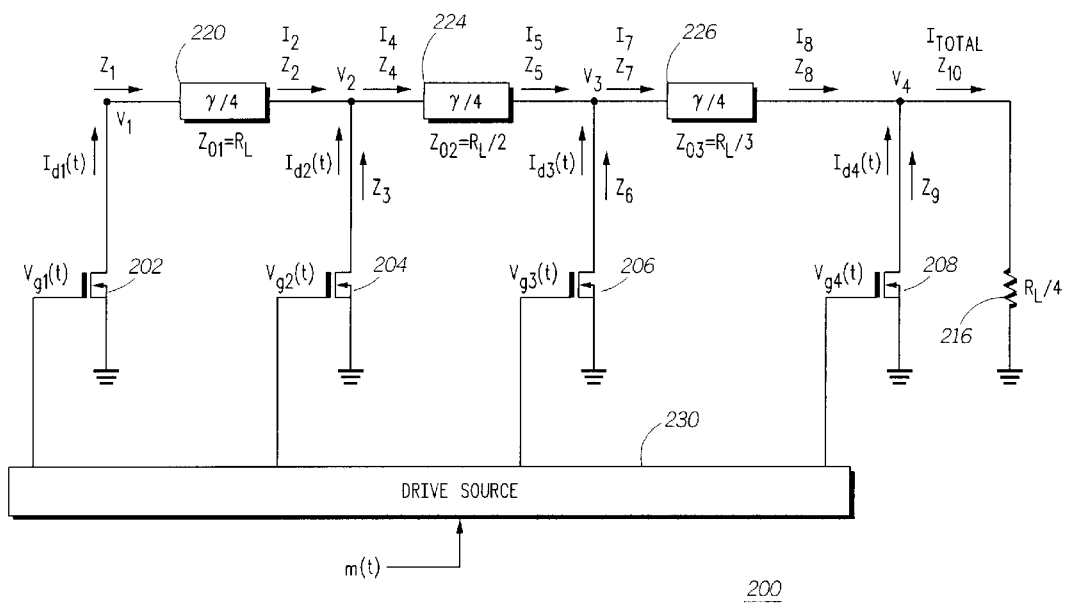
FIG. 3 is an exemplary four-stage high efficiency distributed amplifier structure consistent with certain embodiments of the present invention.

Turning now to FIG. 3, another exemplary amplifier circuit 200 using a tapered distributed transmission line structure is presented further illustrating the concepts of the present invention. In this embodiment, a four-stage amplifier is presented in which FET transistors (serving as amplifiers) 202, 204, 206 and 208 each contribute drive currents to drive a load 216. Amplifiers 202 and 204 are separated by a quarter wavelength transmission line 220 at their output nodes (the drains) having characteristic impedance $R_L$. Similarly, amplifiers 204 and 206 are separated by a quarter wavelength transmission line 224 having characteristic impedance $R_L/2$. Finally, Amplifiers 206 and 208 are separated by a quarter wavelength transmission line 226 having characteristic impedance $R_L/3$. This produces a tapered transmission line arrangement, according to preferred implementations. A drive source 230 is shown driving the four-stage amplifier 200 in accord with the principles of the present invention.

The term "stage" as used herein is a term of convenience in referencing the various amplifiers making up a distributed amplifier. Those having ordinary skill in the art will appreciate, however, that the term should not imply that the "stages" are cascaded to produce a multiplicative effect. Rather, the individual "stages" of the present distributed amplifier contribute to the overall output power delivered to the load in an additive manner. Thus, all things being equal, a four-stage distributed amplifier can deliver power output to a load that is the sum of the contributions of each of the four stages, and those contributions may or may not be equal at maximum power output.

The characteristic impedances of transmission lines 220, 224 and 226 are determined in this example using a virtual impedance model and solving for the virtual impedance needed to have each transistor operate under identical load conditions at maximum drain current output from each transistor, looking at the impedance at each node as will be shown more fully later.

Generally speaking, amplifier 200 operates in a manner similar to that of amplifier 100 of the present example with several ranges of operation. At full maximum output, all four transistors 202, 204, 206 and 208 are driving the load at maximum output to achieve maximum efficiency.

When a first range of output less than maximum output is needed (i.e., the input envelope drops below maximum), the drive to the fourth stage (rightmost stage 208) is reduced from maximum to zero. Simultaneously, the drive to the third stage 206 is reduced to a lesser degree down to some range limit value while the first two stages continue to produce maximum output. Stages 206 and 208 continue to produce output at peak efficiency, even though their output is less than maximum because the virtual impedance load seen by each stage is modulated to achieve maximum efficiency.

When a second range of output power is needed due to further reduction in input signal, the drive to the third stage 206 is further reduced while simultaneously reducing the drive to the second stage. In this range the fourth stage 208 is turned off and the first stage continues to deliver maximum power at maximum efficiency. Stages 204 and 206 continue to produce output at peak efficiency, even though their output is less than maximum because the virtual impedance load seen by each stage is modulated to achieve maximum efficiency.

When a third range of further reduced output power is needed, a similar action occurs with the third stage 206 turning completely off along with the fourth stage, while the drive to the second stage 204 and the first stage 202 are reduced. The first and second stages 202 and 204, although producing less than maximum output, continue to produce output at or near peak efficiency in this range and the overall amplifier efficiency remains at or near peak efficiency.

When a final range of reduced power output is reached, the only transistor remaining to contribute to the output is transistor 202. Transistors 204, 206 and 208 are all cut off and transistor 202 operates at gradually reduced output and efficiency until there is no output.

Figure 4:
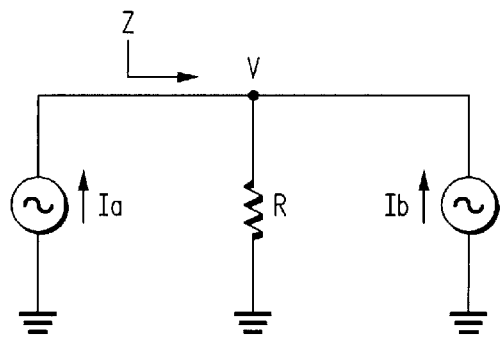
FIG. 4 is a diagram used to illustrate a virtual impedance analysis.

In order to understand the details of the operation of the amplifier 200, significant values at the end points of the various ranges are derived below in detail. It is helpful to analyze the operation of this circuit from the load back in this process in order to appreciate the operation. But, before proceeding with the analysis of amplifier 200, consider a generalized view at any given node as shown in FIG. 4. The impedance looking into this node can be determined using basic circuit analysis and is given by:

$$Z = \frac{V}{I_a} = \frac{R \cdot (I_a + I_b)}{I_a} = R \cdot \left[1 + \frac{I_b}{I_a}\right] \qquad \text{Equation 13}$$

This Equation 13 takes the same form as that of Equation 5 above and illustrates that the impedance Z seen at any given point in the active circuit of FIG. 4 is a function not only of purely passive circuit elements, but also is a function of the active elements and the currents produced thereby. Thus, the "virtual impedance" Z can be controlled by application of appropriate currents $I_a$ and $I_b$ with the resulting virtual impedance being a function of the ratio of the two currents. Applying similar analysis to each of the nodes of FIG. 3, under the assumption that all currents are added in phase, and working from the load back, the following can be determined, with Equation 14 being trivial since there are no currents to sum and the load is shown to be purely resistive.

$$Z_{10} = \frac{R_L}{4} \qquad \text{Equation 14}$$

$$Z_9 = \frac{R_L}{4} \cdot \left[1 + \frac{I_8}{I_{d4}}\right] \qquad \text{Equation 15}$$

Now consider the circumstance wherein all of the drain currents are maximized so that:

$$I_{d1} = I_{d1MAX} = I_{d2} = I_{d2MAX} = I_{d3} = I_{d3MAX} = I_{d4} = I_{d4MAX} = I_{MAX} \qquad \text{Equation 16}$$

which means that:

$$I_{TOTAL} = I_{d1MAX} + I_{d2MAX} + I_{d3MAX} + I_{d4MAX} = 4I_{MAX} \qquad \text{Equation 17}$$

and:

$$I_2 = I_{MAX} \qquad \text{Equation 18}$$

and:

$$I_5 = I_2 + I_{d2MAX} = 2I_{MAX} \qquad \text{Equation 19}$$

and:

$$I_8 = I_5 + I_{d3MAX} = 2I_{MAX} \qquad \text{Equation 20}$$

In this case, Equation 5 becomes:

$$Z_9 = \frac{R_L}{4} \cdot \left[1 + \frac{3I_{MAX}}{I_{MAX}}\right] = \frac{R_L}{4} \cdot [4] = R_L \qquad \text{Equation 21}$$

Now consider the case where the value of $I_{D4}$ is reduced to zero by reducing the drive to the final stage transistor 208. In this case the impedance given by Equation 15 is given by:

$$Z_9 = \frac{R_L}{4} \cdot \left[1 + \frac{I_8}{\to 0}\right] \to \infty \qquad \text{Equation 22}$$

So, as the current from the fourth transistor is cut off, the impedance $Z_9$ seen looking into the final stage transistor approaches $\infty$. A similar minimum and maximum analysis applied to $Z_8$ gives the following results:

$$Z_8 = \frac{R_L}{4} \cdot \left[1 + \frac{I_{MAX}}{3I_{MAX}}\right] = \frac{R_L}{4} \cdot \left[\frac{4}{3}\right] = \frac{R_L}{3} \qquad \text{Equation 23}$$

-continued $$Z_8 = \frac{R_L}{4} \cdot \left[1 + \frac{0}{3I_{MAX}}\right] = \frac{R_L}{4} \qquad \text{Equation 24}$$

As $Z_8$ goes from its maximum value given by Equation 23 to its minimum value given by Equation 22, the impedance seen at $Z_7$ changes as shown in the equations below. When the impedance seen by the third transmission line 226 is equal to the transmission line's characteristic impedance, the value of $Z_7$ is given by:

$$Z_7 = \frac{R_L}{3} = Z_{03} \qquad \text{Equation 25}$$

When $Z_8$ deviates from the value of the characteristic impedance of the quarter wave transmission line 226, (i.e., when it approaches its minimum value as given by Equation 24), the impedance seen at $Z_7$ can be determined from the relationship of Equation 26 below which defines the impedance of for a quarter wave transmission line terminated by any given termination impedance.

$$\left(\frac{R_L}{4}\right) \cdot (Z_7) = \left(\frac{R_L}{3}\right)^2 \qquad \text{Equation 26}$$

Solving Equation 26 for $Z_7$ yields:

$$Z_7 = \left(\frac{R_L^2}{9}\right) \cdot \left(\frac{4}{R_L}\right) = \frac{4R_L}{9} \qquad \text{Equation 27}$$

In accordance with the principles of operation described above, it is desired that over the first range of operation where the currents of $I_{d3}(t)$ and $I_{d4}(t)$ are reduced, the first two stages 202 and 204 should continue to operate at maximum output and maximum efficiency. For this to hold true, the impedance $Z_4$ seen by the transistor 204, and thus $Z_5$ seen by transmission line 224 should remain constant over this range. For now, assume this is the case, and thus at the range limits:

$$Z_5 = \frac{R_L}{3} \cdot \left[1 + \frac{I_{MAX}}{2I_{MAX}}\right] = \frac{R_L}{2} \qquad \text{Equation 28}$$

and $$\frac{R_L}{2} = \frac{4R_L}{9} \cdot \left[1 + [X] \cdot \frac{I_{MAX}}{2I_{MAX}}\right] \qquad \text{Equation 29}$$

where X represents a fraction of the maximum current. Solving for X, it is determined that X=¼ at the other end of the range. Thus, by adjusting $I_{d3}(t)$ from $I_{d3MAX}(t)$ to (¼)$I_{d3MAX}(t)$ while $I_{d4}(t)$ is adjusted from $I_{d4MAX}(t)$ to a value of zero, the impedance $Z_5$ is kept constant at a value of $R_L/2$ so that first and second stages 202 and 204 continue to operate at maximum output and efficiency during the first range of output values. Over this same range, $Z_6$ is given by:

$$Z_6 = \frac{R_L}{3} \cdot \left[1 + \frac{2I_{MAX}}{I_{MAX}}\right] = R_L \qquad \text{Equation 30}$$

and $$Z_6 = \frac{4R_L}{9} \cdot \left[1 + \frac{2I_{MAX}}{\frac{1}{4} \cdot I_{MAX}}\right] \rightarrow 4R_L \quad \text{Equation 31}$$

Now consider the second range of operation wherein transistor 208 is cut off and transistor 206 is driven to generate drain currents in the range between $(\frac{1}{4})I_{d3MAX}(t)$ to zero. Through this range, the value of $Z_5$ is given by:

$$Z_5 \frac{4R_L}{9} \cdot \left[1 + \frac{\frac{1}{4}I_{MAX}}{2I_{MAX}}\right] = \frac{R_L}{2} \quad \text{Equation 32}$$

and $$Z_5 = \frac{4R_L}{9} \cdot \left[1 + \frac{0}{2I_{MAX}}\right] = \frac{4R_L}{9} \quad \text{Equation 33}$$

Over this same second range of operation, $Z_4$ changes value in accord with the change of value of $Z_5$. Over this range, the current through transistor 206 goes to zero, and thus, the impedance $Z_6 \rightarrow \infty$. When $Z_5$ is $R_L/2$=the characteristic impedance of the transmission line 224, the value $Z_4$ is:

$$Z_4 = \frac{R_L}{2} = Z_{02} \quad \text{Equation 34}$$

When the value of $Z_5$ changes to its other extreme of this range of $4R_L/9$, the value of $Z_4$ is determined from the equation for the impedance of a terminated quarter wavelength transmission line as follows:

$$\left(\frac{4R_L}{9}\right) \cdot (Z_4) = \left(\frac{R_L}{2}\right)^2 \quad \text{Equation 35}$$

Solving Equation 35 for $Z_4$ yields:

$$Z_4 = \left(\frac{R_L^2}{4}\right) \cdot \left(\frac{9}{4R_L}\right) = \frac{9R_L}{16} \quad \text{Equation 36}$$

During this range of operation, it is desired to keep the first stage amplifier 202 operating at maximum output and maximum efficiency. For this to occur, the load $Z_1$ seen by transistor 202 should remain constant. This suggests that the load $Z_2$ seen by the transmission line 220 should also remain constant as $I_{d2}(t)$ goes from its maximum value to some fraction Y of its maximum value. Thus:

$$Z_2 = \frac{R_L}{2} \cdot \left[1 + \frac{I_{MAX}}{I_{MAX}}\right] = R_L \quad \text{Equation 37}$$

and $$R_L = \frac{9R_L}{16} \cdot \left[1 + [Y] \cdot \frac{I_{MAX}}{I_{MAX}}\right] \quad \text{Equation 38}$$

Solving for Y it is determined that Y=7/9 at the other end of the range. Thus, by adjusting $I_{d2}(t)$ from $I_{d2MAX}(t)$ to $(7/9)I_{d2MAX}(t)$ while $I_{d3}(t)$ is adjusted from $(\frac{1}{4})I_{d3MAX}(t)$ to a value of zero, the impedance $Z_2$ is kept constant at a value of $R_L$ so that first stage 202 continues to operate at maximum output and efficiency during this range of output values. Over this same range, $Z_3$ is given by:

$$Z_3 = \frac{9R_L}{16} \cdot \left[1 + \frac{2I_{MAX}}{\frac{7}{9}I_{MAX}}\right] = \frac{9R_L}{7} \quad \text{Equation 39}$$

and $$Z_3 = \frac{9R_L}{16} \cdot \left[1 + \frac{I_{MAX}}{0}\right] \rightarrow \infty \quad \text{Equation 40}$$

Now consider the operation of $I_{d2}(t)$ ranging in value from $(7/9)I_{d2MAX}(t)$ down to zero. The value of $Z_2$ at each end of the range is given by:

$$Z_2 = \frac{9R_L}{16} \cdot \left[1 + \frac{\frac{7}{9}I_{MAX}}{I_{MAX}}\right] = R_L \quad \text{Equation 41}$$

and $$Z_2 = \frac{9R_L}{16} \cdot \left[1 + \frac{0}{I_{MAX}}\right] = \frac{9R_L}{16} \quad \text{Equation 42}$$

When $Z_2=R_L$, the value of $Z_1$ is:

$$Z_1 = R_L \quad \text{Equation 43}$$

When $Z_2=(9/16)R_L$, the value of $Z_1$ can be determined from the equation for a terminated quarter wavelength transmission line as:

$$\left(\frac{9R_L}{16}\right) \cdot (Z_1) = R_L^2 \quad \text{Equation 44}$$

Solving Equation 44 for $Z_1$ yields:

$$Z_1 = R_L^2 \cdot \left(\frac{16}{9R_L}\right) = \frac{16R_L}{9} \quad \text{Equation 45}$$

It is now desired to keep the voltage $V_1$ at the junction of the transistor 202 and the transmission line 220 constant as $I_{d1}(t)$ changes in value from $I_{d1MAX}(t)$ to $(K)I_{d1MAX}(t)$ where K is a fractional part of the maximum current.

$$I_{d1MAX}(t) \cdot R_L = (K)I_{d1MAX}(t) \cdot \frac{16R_L}{9} \quad \text{Equation 46}$$

Solving for K results in:

$$K=9/16 \quad \text{Equation 47}$$

The total load current delivered to the load 216 is shown as $I_{TOTAL}$. The square of this current $I_{TOTAL}$ is proportional to the output power delivered to the load and is given by:

$$P_{OUT} = I_{TOTAL}^2 \frac{R_L}{4} \quad \text{Equation 48}$$

When designing the amplifier for the tapered distributed transmission line implementation shown above, the characteristic impedances of the transmission lines can be determined by applying the virtual impedance equation to each node with the objective of operating each amplifier stage into an identical load having value $R_L$. The output from each transistor is additive to the total current delivered to the load, so that for a four stage distributed amplifier, ¼ of the total maximum current is delivered to the load by any individual transistor. At the load, there are two currents summed into the node, $I_g$ and $I_{d4}$. At maximum current, the single device virtual load impedance is given by:

$$\frac{R_L}{4} \cdot \left(1 + \frac{3}{1}\right) = R_L \qquad \text{Equation 49}$$

while the virtual load impedance seen by transistor 206 is given by:

Therefore, the characteristic impedance of transmission line 226 is designed to have a characteristic impedance of $R_L$ ohms. As previously mentioned, the transmission lines may be implemented as lumped element devices or as actual transmission line sections of any suitable design.

The values derived above for the several ranges of operation of amplifier 200 are tabulated, below in TABLE 1.

TABLE 1

| Parameter | MAX OUTPUT | Range 1 | Range 2 | Range 3 | Range 4 | ZERO OUTPUT |
|---|---|---|---|---|---|---|
| $I_{d1}$ | $I_{MAX}$ | $I_{MAX}$ | $I_{MAX}$ | $I_{MAX} \to (9/16)I_{MAX}$ | $(9/16)I_{MAX} \to 0$ | 0 |
| $I_{d2}$ | $I_{MAX}$ | $I_{MAX}$ | $I_{MAX} \to (7/9)I_{MAX}$ | $(7/9)I_{MAX} \to 0$ | 0 | 0 |
| $I_{d3}$ | $I_{MAX}$ | $I_{MAX} \to (1/4)I_{MAX}$ | $(1/4)I_{MAX} \to 0$ | 0 | 0 | 0 |
| $I_{d4}$ | $I_{MAX}$ | $I_{MAX} \to 0$ | 0 | 0 | 0 | 0 |
| $I_{TOTAL}$ | $4I_{MAX}$ | $4I_{MAX} \to (9/4)I_{MAX}$ | $(9/4)I_{MAX} \to (16/9)I_{MAX}$ | $(16/9)I_{MAX} \to (9/16)I_{MAX}$ | $(9/16)I_{MAX} \to 0$ | 0 |
| $Z_1$ | $R_L$ | $R_L$ | $R_L$ | $R_L$ | $R_L \to 16R_L/9$ | $16R_L/9 \to \infty$ |
| $Z_2$ | $R_L$ | $R_L$ | $R_L$ | $R_L \to 9R_L/16$ | $9R_L/16$ | $9R_L/16$ |
| $Z_3$ | $R_L$ | $R_L$ | $R_L \to 9R_L7$ | $9R_L/7 \to \infty$ | $\infty$ | $\infty$ |
| $Z_4$ | $R_L/2$ | $R_L/2$ | $R_L/2 \to 9R_L/16$ | $9R_L/16$ | $9R_L/16$ | $9R_L/16$ |
| $Z_5$ | $R_L/2$ | $R_L/2 \to R_L/9$ | $R_L/9$ | $R_L/9$ | $R_L/9$ | $R_L/9$ |
| $Z_6$ | $R_L$ | $R_L \to 4R_L$ | $4R_L \to \infty$ | $\infty$ | $\infty$ | $\infty$ |
| $Z_7$ | $R_L/3$ | $R_L/3 \to 4R_L9$ | $4R_L/9$ | $4R_L/9$ | $4R_L/9$ | $4R_L/9$ |
| $Z_8$ | $R_L/3$ | $R_L/3 \to R_L/4$ | $R_L/4$ | $R_L/4$ | $R_L/4$ | $R_L/4$ |
| $Z_9$ | $R_L$ | $R_L \to \infty$ | $\infty$ | $\infty$ | $\infty$ | $\infty$ |
| $Z_{10}$ | $R_L/4$ | $R_L/4$ | $R_L/4$ | $R_L/4$ | $R_L/4$ | $R_L/4$ |

$$\frac{R_L}{4} \cdot \left(1 + \frac{1}{3}\right) = \frac{R_L}{3} \qquad \text{Equation 50}$$

Therefore, the characteristic impedance of transmission line 226 is designed to have a characteristic impedance of $R_L/3$ ohms.

Moving back one node to the node at transistor 206's drain, the single device virtual impedance load is given by:

$$\frac{R_L}{3} \cdot \left(1 + \frac{2}{1}\right) = R_L \qquad \text{Equation 51}$$

while the virtual load impedance seen by transistor 204 is given by:

$$\frac{R_L}{3} \cdot \left(1 + \frac{1}{2}\right) = \frac{R_L}{2} \qquad \text{Equation 52}$$

Therefore, the characteristic impedance of transmission line 224 is designed to have a characteristic impedance of $R_L/2$ ohms.

Moving back one node, the single device virtual impedance load is given by:

$$\frac{R_L}{2} \cdot \left(1 + \frac{1}{1}\right) = R_L \qquad \text{Equation 53}$$

while the virtual load impedance seen by transistor 202 is given by:

$$\frac{R_L}{2} \cdot \left(1 + \frac{1}{1}\right) = R_L \qquad \text{Equation 54}$$

Figure 5:
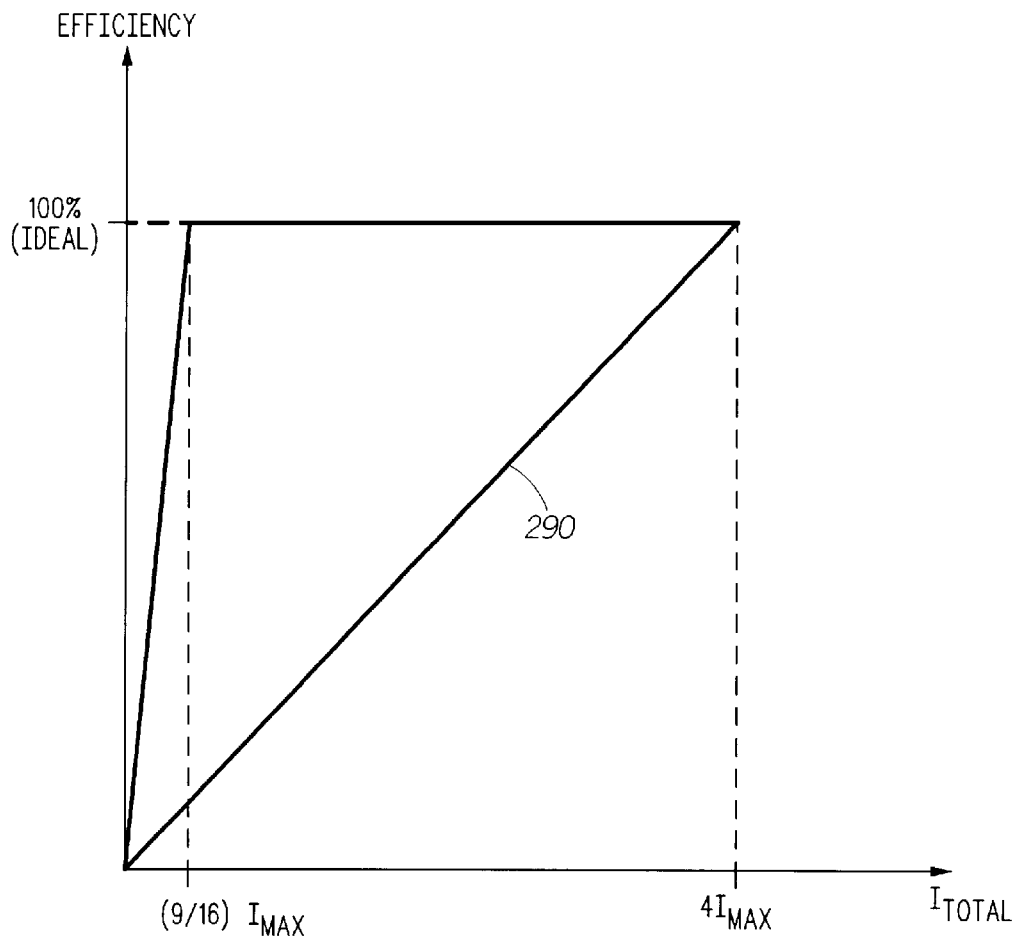
FIG. 5 is a graph depicting the conversion efficiency of the amplifier circuit 200 of FIG. 3.

Thus, from the above development, it can be seen that as the drive to each successive stage is reduced to zero, the load seen by each stage is modulated to achieve maximum efficiency up until the time that only a single stage of amplification is contributing to the output power delivered to the load 216. At this point, efficiency begins to fall off. But, prior to this point, extremely high efficiency is maintained throughout the range of input values. This is illustrated in FIG. 5 which shows curve 250 which graphs the conversion efficiency versus output current $I_{TOTAL}$ for amplifier 200 illustrating that the conversion efficiency remains near 100% of maximum theoretical efficiency (for the particular amplifier class) until output current drops by about 18 dB from maximum.

This amplifier 200 provides a load modulation method of extending the peak output signal level conversion efficiency to levels down 9/64 below the peak output voltage and over almost an 18 dB power output range. This efficiency benefit provides a significant improvement in battery life when used in the RF amplifier section of portable communication devices.

Figure 6:
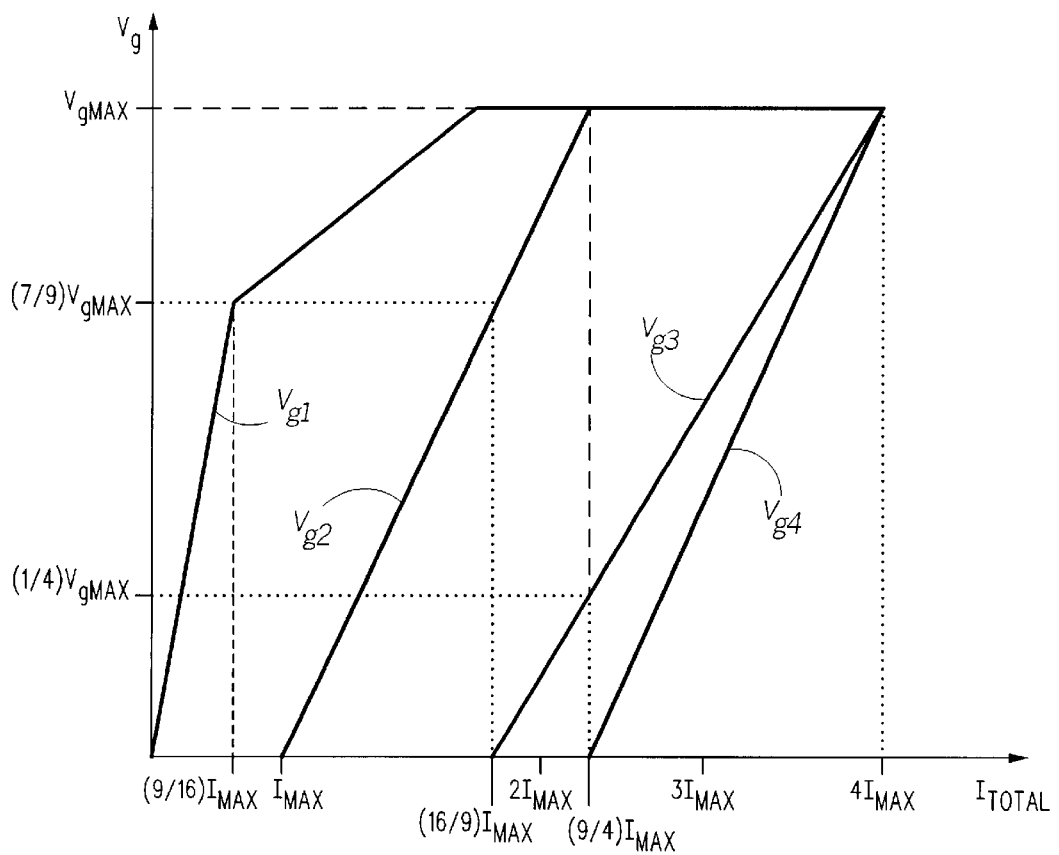
FIG. 6 is a graph depicting the control voltages used to drive the amplifier circuit 200 of FIG. 3.

In order to achieve this end result, control signals that drive the amplifier stages are applied to the gates (in this FET example) of transistors 202, 204, 206 and 208 to appropriately control the virtual impedances seen by the amplifier stages. Control voltage $V_{g1}$ is applied to the gate of transistor 202, $V_{g2}$ is applied to the gate of transistor 204, $V_{g3}$ is applied to the gate of transistor 206, and $V_{g4}$ is applied to the gate of transistor 208. In each case, it is assumed that the drain current at each respective transistor is proportional to its gate voltage and that the control voltage is proportional to the gate voltage. FIG. 6 illustrates graphically how the control voltages are varied in this example to achieve this result. The control voltages of this example, and the drive signals for any amplifier in general according to certain embodiments of the invention, may be generated in any number of ways within a suitable drive source 230 including, but not limited to, use of lookup tables and/or digital signal processing techniques.

Control voltage $V_{g4}$ is varied linearly from zero to the maximum value of the gate voltage as $I_{TOTAL}$ ranges from $(\%)I_{MAX}$ to $4I_{MAX}$. This change in control voltage $V_{g4}$ is carried out as the control voltage $V_{g3}$ applied to transistor 206 simultaneously decreases (at a different rate in this example). Thus, the values of control voltages $V_{g3}$ and $V_{g4}$ act in concert to increase the virtual impedances seen by transistors 206 and 208 so that the current is delivered to the load from the third and fourth stages at maximum efficiency.

Control voltage $V_{g3}$ is varied linearly from zero to the maximum value of the gate voltage as $I_{TOTAL}$ ranges from $(^{16}\!/\!_9)I_{MAX}$ to $4I_{MAX}$. Control voltage $V_{g3}$ is approximately ($\frac{1}{4}$) of the maximum gate voltage at the point $V_{g4}$ reaches zero. Simultaneously, during a portion of the range of operation, the control voltage $V_{g2}$ is varying. The values of control voltages $V_{g3}$ and $V_{g2}$ act in concert to increase the virtual impedances seen by transistors 204 and 206 so that the current is delivered to the load from the second and third stages at maximum efficiency.

Control voltage $V_{g2}$ is varied linearly from zero to the maximum value of the gate voltage as $I_{TOTAL}$ ranges from $(^{9}\!/\!_{16})I_{MAX}$ to $(^{9}\!/\!_4)I_{MAX}$. Control voltage $V_{g2}$ is approximately ($\frac{7}{9}$) of the maximum gate voltage at the point $V_{g3}$ reaches zero. Simultaneously, during a portion of the range of operation, the control voltage $V_{g1}$ is varying. The values of control voltages $V_{g1}$ and $V_{g2}$ act in concert to increase the virtual impedances seen by transistors 202 and 204 so that the current is delivered to the load from the first and second stages is kept at maximum efficiency until no input is delivered to drive transistor 204 and the sole contribution to output power is from transistor 202.

Control voltage $V_{g1}$ is varied linearly from zero to the maximum value of the gate voltage as $I_{TOTAL}$ ranges from zero to $(^{16}\!/\!_9)I_{MAX}$ and $V_{g1}$ reaches its maximum at approximately the point where $V_{g3}$ reaches zero. When the contribution of the second stage 204 reaches zero, transistor 202 is the only transistor driving the load and as the control signal $V_{g3}$ decreases beyond this point, efficiency drops.

To summarize, the control voltage (or current or power) for a given stage is developed as a function of the input signal so that the voltage at each amplifier's output node is maintained constant until only one amplifier stage remains. This virtual impedance is a function of both the drain current of the stage and the current produced by the preceding stage, so that both stages act in concert to assure that a constant output voltage is seen at each node for as long as an output contribution is being made by two or more transistors in the distributed amplifier.

For a given pair of adjacent stages in the distributed amplifier structure (call them first and second stages), the first stage is connected to the second stage through a transmission line, the second stage provides a portion of a virtual impedance load to the first stage. An input signal m(t) to be amplified by the distributed amplifier is used to generate a pair of signals to drive the amplifier. A first drive signal is generated that varies as a function of m(t) to drive the first stage. A second drive signal is generated that varies as a function of m(t) to drive the second stage. The first drive signal varies as a function of m(t) from a maximum to zero as m(t) varies from a maximum value to some value m1, the second drive signal varies as a function of m(t) from a maximum value to zero as m(t) varies from a maximum value to a value m2, where m1 is less than m2. The values can be derived from the graph of FIG. 6 along with the above equations.

Since the present embodiment is illustrated using field effect transistors, the drive signals (or control signals) are represented as voltages (control voltages or drive voltages). However, the control signals could equally well be expressed as currents or powers for other types of amplifiers such as bipolar amplifiers, with the assumption that the collector or emitter current is approximately proportional to a control current applied to the transistor's base. The transmission lines may be either a coaxial, planar, stripline, or other form of actual transmission line, or may be a lumped element approximation of a transmission line, without limitation. In addition, while a tapered distributed transmission line structure is preferred, embodiments using many of the teachings and benefits of the current invention can be realized without the preferred tapered distributed transmission line structure described. Such embodiments are contemplated by the present invention. Other equivalent variations will occur to those skilled in the art.

Amplifier 200 above operates to amplify a plurality of independently varying input signals as follows:

$$I_{TOTAL}=(V_{g1}\cdot g_{m1})+(V_{g2}\cdot g_{m2})+(V_{g3}\cdot g_{m3})+(V_{g4}\cdot g_{m4}) \quad \text{Equation 55}$$

Figure 7:
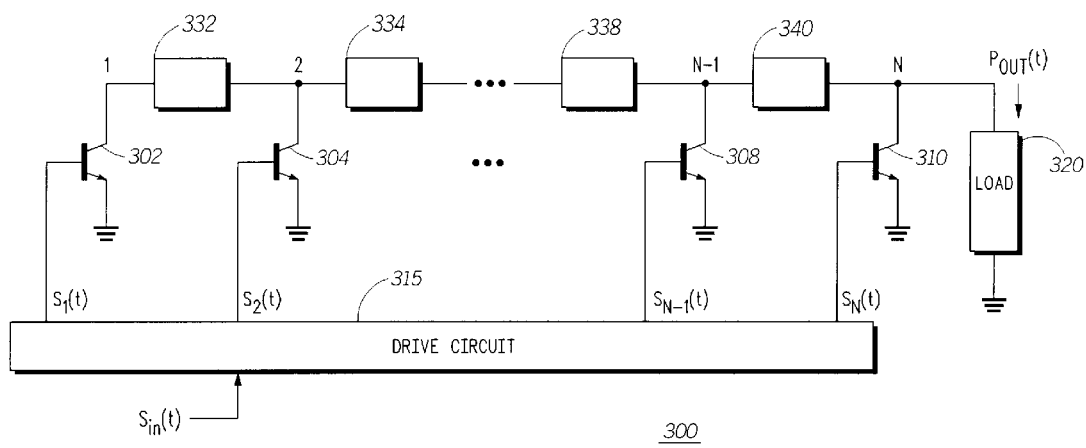
FIG. 7 is a schematic of a generalized distributed amplifier consistent with certain embodiments of the present invention.

In order to achieve the efficiency described herein, the four gate voltages are developed within drive source 230 as a function of a modulating signal m(t) to be amplified. One issue presented to the designer is how to generate these four signals as a function of this modulating signal in the general case. In order to address this issue, consider an N stage generalized example as illustrated in FIG. 7. While it is complex to generate a generalized expression for each drive signal due to many design variables, the principles described herein can be used to readily derive the drive signals for any given example.

The devices used for amplifiers can be bipolar devices, MOSFET devices, MESFET devices, or any other semiconductor or vacuum tube (or other technology) amplifying device. Accordingly, the exact input signal and drive signals can be viewed as either voltagess or currents. Moreover, depending on the exact device selected and its class of operation, the output currents and voltages are a function of the, voltage gain, current gain, transconductance, etc. properties of the amplifying device. Thus, for purposes of the present development, the drive signals used to drive the various amplifier sections of any given amplifier structure consistent with certain embodiments of the current invention are expressed in terms of the output signals they produce.

Referring now to FIG. 7, a generalized distributed amplifier circuit 300 according to the present invention is illustrated in which N transistors 302, 304, . . . 308, 310 are driven at their bases (in this bipolar example) by a drive circuit 315. The drive circuit 315 receives an input power signal $P_{in}(t)$, or in general an input signal $S_{IN}(t)$, and from that input signal produces a plurality of N drive signals $S_1(t) \ldots S_N(t)$ that are applied as inputs to the transistors 302, 304, . . . 308, 310 such that the output signal delivered to load 320 is given by $P_{out}(t)=GP_{in}(t)$, with G representing the amplifier circuit's power gain. The collectors represent the output current sources for each of the N transistors and produce output current into N nodes 1 through N. Each of the N nodes are separated by a transmission line, or equivalent circuit, 332, 334, . . . 338, 340 that is preferably in the form of a tapered transmission line. The drive signal generating circuit produces the N drive signals such that over a first range of operation:

$S_N(t)$ produces an output current from transistor N ranging from a maximum output current to zero;

$S_{N-1}(t)$ produces an output current from transistor N−1 that preserves the voltage at node N−1 constant over the range of output current from transistor N; and $S_1(t)$ through $S_{N-2}(t)$ produce maximum output current from transistors 1 through N−2.

Over a second range of operation:

$S_N(t)$ produces an output current from transistor N of zero;

$S_{N-1}(t)$ produces an output current from transistor N−1 ranging from a current less than maximum to zero;

$S_{N-2}(t)$ produces an output current from transistor N−2 that preserves the voltage at node N−2 constant over the range of output current from transistor N−1; and $S_1(t)$ through $S_{N-3}(t)$ produce maximum output current from transistors 1 through N−3.

Over a third range of operation:

$S_N(t)$ produces an output current from transistor N of zero;

$S_{N-1}(t)$ produces an output current from transistor N of zero;

$S_{N-2}(t)$ produces an output current from transistor N−2 ranging from a current less than maximum to zero;

$S_{N-3}(t)$ produces an output current from transistor N−3 that preserves the voltage at node N−3 constant over the range of output current from transistor N−2; and $S_1(t)$ through $S_{N-4}(t)$ produce maximum output current from transistors 1 through N−4.

This operation continues through multiple ranges of operation depending upon the number of stage N until finally only the first stage is producing output current in which case over an $N^{th}$ range of operation:

$S_N(t)$ through $S_2(t)$ produces an output current from transistors N through 2 of zero; and $S_1(t)$ produces an output current from transistor 1 ranging from a current less than maximum to zero.

The above operation is possible, as previously described, by modulating the virtual impedance at each node to permit the voltage at the output to remain constant while maintaining high efficiency until the last range of the last stage of operation.

In the case of the four-stage amplifier 200, the drive signals to the transistors 202, 204, 206 and 208 can be determined as follows. Beginning with the output node current $I_{total}$ equal to the summation of the four device currents translated across device 206 and 208 output interconnect network, $I_7$ is determined as follows:

$$I_7 = \frac{V_4}{Z_{03}} = I_{Total}\left[\frac{\frac{R_L}{4}}{\frac{R_L}{3}}\right] = \frac{3}{4}[I_{01} + I_{02} + I_{03} + I_{04}] \quad \text{Equation 54}$$

Where the currents $I_{0x}$ represent the individual device currents $I_{dx}(t)$ translated to the output load $R_L/4$. At the maximum output power operating point the device currents are expected to be equal at $I_{dmax}$ and Equation 54 becomes:

$$I_7 = \left(\frac{3}{4}\right)4I_{dmax} = 3I_{dmax} \quad \text{Equation 55}$$

rewriting this relation in a general form with the constraint that $I_{d3}$ and $I_{d4}$ are decreased in a manner to preserve the operating conditions of $I_{51}$ and $I_{52}$ (currents attributed to device 202 and 204 at $I_5$ branch), leads to:

$$I_{51max} + I_{52max} + I_{d3} = I_7 = \left(\frac{3}{4}\right)(I_{01max} + I_{02max} + I_{03max} + I_{d4}) \quad \text{Equation 56}$$

replacing $I_{0x(max)}$ with $I_{dmax}$ and deducing we obtain the following relation:

$$I_{d3} = \frac{I_{dmax}}{4} + \frac{3I_{d4}}{4} \quad \text{Equation 57}$$

a relation defining $I_{d3}$ as a function of $I_{d4}$ to preserve the operating load conditions on sections 202 and 204 constant independent of the current $I_{d4}$.

Keeping the first two sections operating in their peak output point maintains their maximum efficiency while the output power is lowered with a reduction in the third and fourth distributed amplifier section currents. The next step is development of a relation for $I_{d3}$ and $I_{d4}$ as a function of $P_{out}$, the output power dissipated in the load $R_L/4$.

$$P_{out} = GP_{in} = \quad \text{Equation 58}$$
$$\left(\frac{R_L}{4}\right)(I_{01max} + I_{02max} + I_{d3} + I_{d4})^2 = \frac{R_L}{64}(9I_{dmax} + 7I_{d4})^2$$

where G is the gain of device 208. Solving for the currents over the range $81I_{dmax}R_L/64 <= |P_{out}| <= 4I_{dmax}R_L$ gives:

$$I_{d4} = \frac{1}{7}\left[\left(\frac{64P_{out}}{R_L}\right)^{\frac{1}{2}} - 9I_{dmax}\right] \quad \text{Equation 59}$$

and $$I_{d3} = \frac{3}{28}\left[\left(\frac{64P_{out}}{R_L}\right)^{\frac{1}{2}} - 9I_{dmax}\right] + \frac{I_{dmax}}{4} \quad \text{Equation 60}$$

By factoring in the gain (or transconductance) of the devices 206 and 208, these relationships for $I_{d3}$ and $I_{d4}$ can be used to directly solve for the input signal levels $|V_{g3}(t)|$ and $|V_{g4}(t)|$ as a function of the desired output power range (and thus the input power range) in the range of $81R_L/64 <= |P_{out}| = |GP_{in}| <= 4R_L$.

Continuing on with this procedure to obtain driving functions for $V_{g1}(t)$ and $V_{g2}(t)$ as a function of desired output power follows in a similar manner with the third output section load impedance $$Z_7 = \frac{Z_{03}^2}{\frac{R_L}{4}} = \frac{4R_L}{9} \quad \text{Equation 61}$$

and the node voltage $$V_3 = I_7 Z_7 = (I_{51} + I_{52} + I_{d3})\frac{4R_L}{9} \quad \text{Equation 62}$$

Transforming this through the quarter wavelength transmission line:

$$I_4 = \frac{V_3}{Z_{o2}} = \frac{8}{9}(I_{51} + I_{52} + I_{d3}) = I_{21} + I_{d2} \quad \text{Equation 63}$$

solving for $i_{d2}$ as a function of $0 \leq I_{d3} \leq I_{dmax}/4$ $$I_{d2} = \frac{7I_{dmax}}{9} + \frac{8I_{d3}}{9} = \frac{7I_{dmax} + 8I_{d3}}{9} \quad \text{Equation 64}$$

and output power is $$P_{out} = GP_{in} = I_7^2 Z_7 = \quad \text{Equation 65}$$
$$\frac{4R_L}{9}(I_{51} + I_{52} + I_{d3})^2 = \frac{R_L}{4}(I_{01max} + I_{d2} + I_{d3} + I_{d4})^2$$

Setting $I_{01(max)}$ equal to $I_{dmax}$, $I_{d4}$ equal to zero, and replacing $I_{d2}$ in terms of $I_{d3}$, Equation 65 becomes:

$$P_{out} = GP_{in} = \frac{R_L}{4}\left[\frac{16I_{dmax} + 17I_{d3}}{9}\right]^2 \quad \text{Equation 66}$$

over the $P_{out}$ range $64I_{dmax}R_L/81 \leq |P_o| \leq 81I_{dmax}R_L/64$, $i_{c4}=0$, and $$I_{d3} = \frac{\sqrt{\frac{4P_{out}}{R_L}} - 16I_{dmax}}{17} \quad \text{Equation 67}$$

over the range $0 \leq I_{d3} \leq I_{d3(max)}/4$ and $7I_{d2(max)}/9 \leq I_{d2} \leq I_{d2(max)}$ for Equation 64. Thus, for the second range of operation, the above equations for $I_{d2}$ and $I_{d3}$ can be solved for input signals $V_{g2}$ and $V_{g3}$ to produce the desired efficiency.

Continuing on to the next range of operation once $I_{d3}=0$, $$Z_7 = Z_5 = \frac{Z_{o3}^2}{\frac{R_L}{4}} = \frac{4R_L}{9} \quad \text{Equation 68}$$

and $$Z_4 = \frac{Z_{o2}^2}{\frac{4R_L}{9}} = \frac{4R_L}{9}\left(\frac{R_L}{2}\right)^2 = \frac{9R_L}{16} \quad \text{Equation 69}$$

and $$V_2 = (I_{12} + I_{d2})Z_4 = (I_{12} + I_{d2})\left(\frac{9R_L}{16}\right) \quad \text{Equation 70}$$

which is transformed to the current:

$$I_{d1} = \frac{V_2}{Z_{01}} = (I_{12} + I_{d2})Z_4 = (I_{12} + I_{d2})\left(\frac{9}{16}\right) \quad \text{Equation 71}$$

Setting $I_{12}$ with $I_{dmax}$ at the condition $I_{d2}=7I_{dmax}/9$ results in:

$$I_{d1} = \frac{9}{16}(I_{dmax} + I_{d2}) \quad \text{Equation 72}$$

over the range $0 \leq I_{c2} \leq 7I_{c(max)}/9$, and solving for $P_{out}$ $$P_{out} = \quad \text{Equation 73}$$
$$GP_{in} = I_4^2 Z_4 = \frac{9R_L}{16}(I_{41} + I_{d2})^2 = \frac{R_L}{4}(I_{d1} + I_{d2} + I_{d3} + I_{d4})^2$$

Setting $I_{d4}$ and $I_{d3}$ equal to zero, and expressing $I_{d1}$ in terms of $I_{d2}$, Equation 73 becomes:

$$P_{out} = \left(\frac{9I_{dmax} + 25I_{d2}}{16}\right)^2 \frac{R_L}{4} \quad \text{Equation 74}$$

over the range $81i_{dmax}R_L/1024 \leq |P_o| \leq 64i_{dmax}R_L/81$ and $9i_{d1(max)}/16 \leq i_{d1} \leq i_{d1(max)}$ $$I_{d2} = \frac{(16)\left[\sqrt{\frac{4P_{out}}{R_L}}\right] - 9I_{dmax}}{25} \quad \text{Equation 75}$$

and $$I_{d1} = \frac{(16)\left[\sqrt{\frac{4P_{out}}{R_L}}\right] - 9I_{dmax} + I_{dmax}}{25}\left(\frac{9}{16}\right) \quad \text{Equation 76}$$

$$P_{out} = \left(\frac{9I_{d1}}{16}\right)^2 \frac{R_L}{4} \quad \text{Equation 77}$$

over the final range $0 \leq |P_o| \leq 64i_{dmax}R_L/81$ $$I_{d1} = \frac{(16)\left[\sqrt{\frac{4P_{out}}{R_L}}\right]}{9} \quad \text{Equation 78}$$

Thus, for this four-stage example, there are seven drain current equations (59, 60, 64, 67, 72, 75, and 78) representing the drive signals needed to achieve extended linear efficiency performance over output power range $81i_{dmax}R_L/1024 \leq |P_{out}| \leq 4i_{dmax}R_L$. Working back from the required current, the appropriate drive voltages or currents can be generated for each active device.

In the exemplary generalized bipolar amplifier 300 of FIG. 7, a similar process can be used at each stage to compute the required collector current equations. These can then be used to derive base current or voltage required as the drive signals. As a linear amplifier, accurate reproduction of the input signal is desirable minimizing error and distortion terms. What this means (in a preferred ideal case) is the class of operation for each stage would be one with optimized linear performance thus defining the input drive signals based on class of operation as well as the extended linear function. However, the indepenent input signals of this extended linear technology offers a degree of freedom in uniquely defining each stage class of operation for optimized performance.

The above processes have been described in terms of one of the simpler mechanisms for generating appropriate virtual impedances at the various nodes to permit operation of the distributed amplifier structure with enhanced efficiency. However, many other drive mechanisms are possible without departing from the present invention. For example, more complex drive signals can be applied to the distributed amplifier's active elements to permit, for example, three of the active elements to produce reduced output currents simultaneously (rather than two at a time) while maintaining high efficiency of the overall structure. In other embodiments, the output of all of the amplifiers can be adjusted simultaneously using more complex drive signal generation while still maintaining high efficiency. Such variations are contemplated by this invention. However, for ease of understanding, the simplest case is described in detail.

Figure 8:
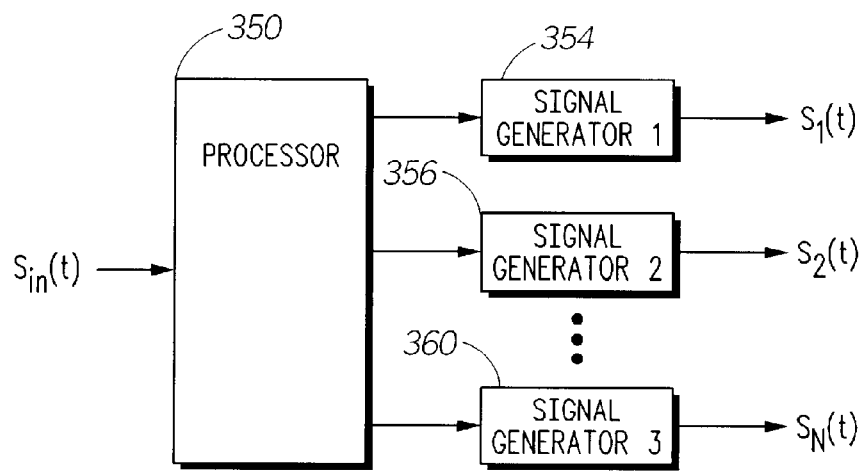
FIG. 8 illustrates an embodiment of a drive circuit 315 consistent with certain embodiment of the present invention.

Referring now to FIG. 8, an exemplary drive circuit 315 is illustrated in which an input signal $S_{in}(t)$ is applied to a processor such as a Digital Signal Processor (DSP) 350. Processor 350 computes the value of signal needed for each input of the distributed amplifier, taking into consideration the voltage or current gain or transconductance of the amplifier. A plurality of N signal generators 354, 356, . . . 560 are then instructed what instantaneous signal to produce by the processor 350.

Figure 9:
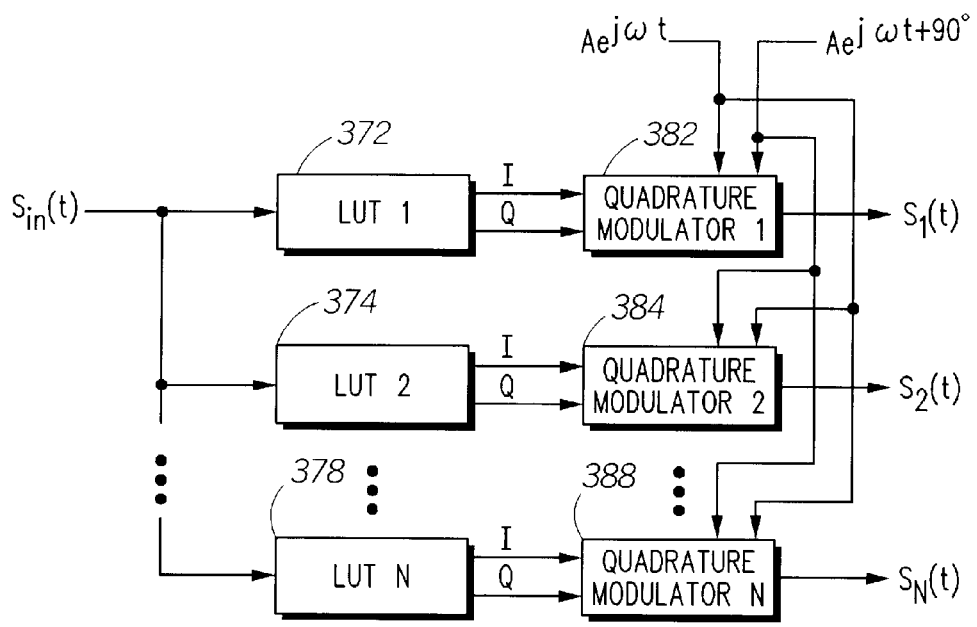
FIG. 9 illustrates another embodiment of a drive circuit 315 consistent with certain embodiment of the present invention.

FIG. 9 illustrates a related embodiment of drive circuit 315 in which the values of the N drive signals is computed using a lookup table. In this case, N lookup tables 372, 374, . . . 378 receive the input signal $S_{in}(t)$ and respectively look up the value required for each amplifier device input. The output is fed to a plurality of N signal generators in the form of quadrature modulators 382, 384, . . . 388.

Figure 10:
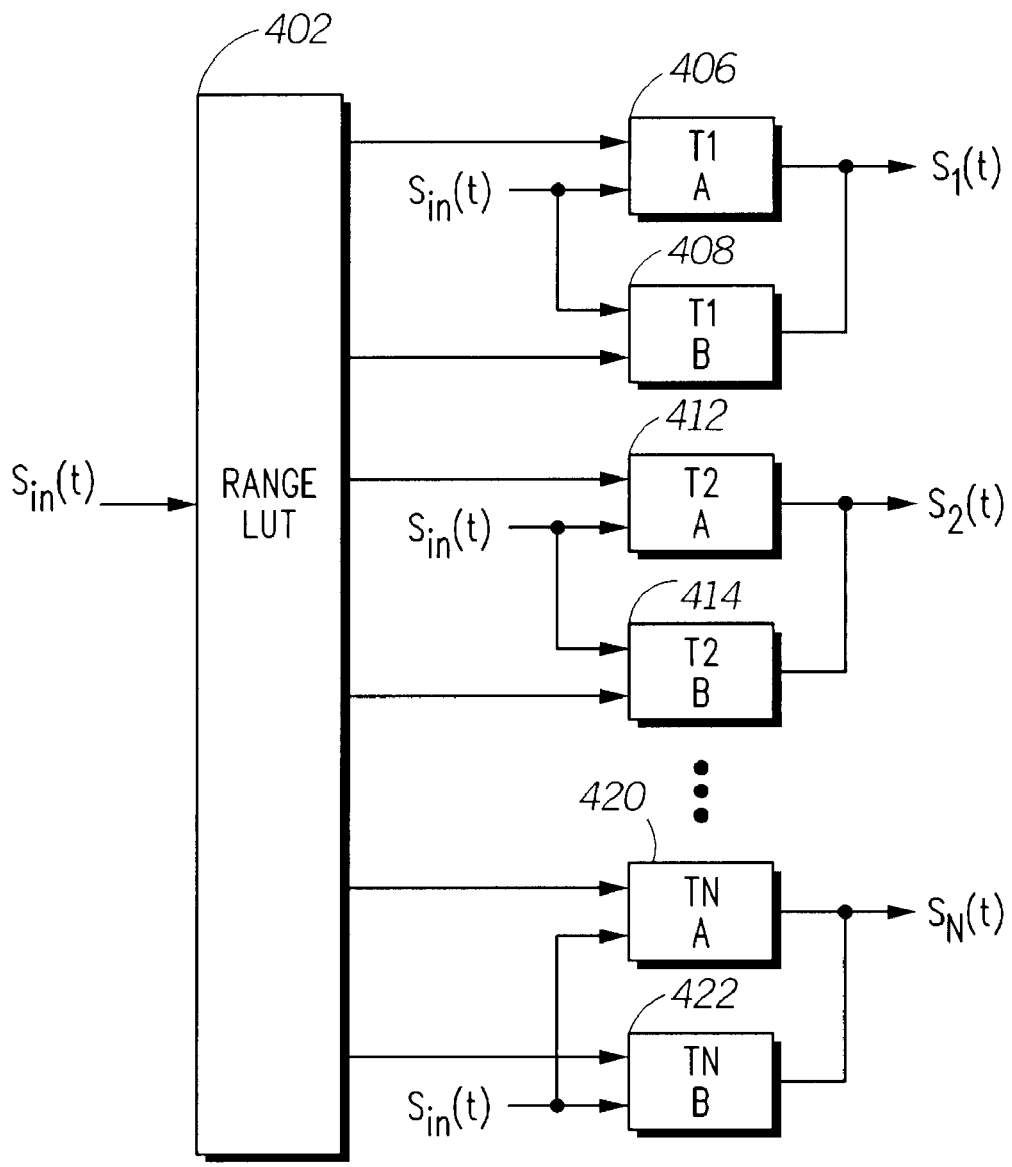
FIG. 10 illustrates another embodiment of a drive circuit 315 consistent with certain embodiment of the present invention.

Yet another example of a drive circuit 315 implementation is illustrated in FIG. 10. In this embodiment, the value of $S_{in}(t)$ is evaluated at 402 to determine a range in which the input value falls. This can be accomplished readily, as illustrated, using a lookup table. Depending upon the range of the input signal, the input is applied to one of several (two illustrated) circuits having fixed transfer functions. For example, the input signal can be processed by a circuit 406 having transfer function T1-A for a first range of values of $S_{in}(t)$ and by circuit 408 having transfer function T1-B for a second range of values of $S_{in}(t)$ to produce an output signal $S_1(t)$. The ranges vary depending upon the stage of amplification and the transfer functions are adapted to each range of operation of each stage. Similar processing for the second stage is carried out in 412 or 414 depending upon the range of operation and so on until the final stage drive signal $S_n(t)$ is generated by either 420 or 422 depending upon the range selected by lookup table 402.

Other embodiments of drive circuits are also possible including circuits using feedback sensed from the output voltage or current at each stage of the distributed amplifier and/or at the load to determine a proper range or input signal to create. Other embodiments of active/passive generation of the various drive signals will occur to those skilled in the art.

According to the above-described embodiments, a method of operating an N stage distributed amplifier to deliver power to a load can be generally described, without limitation, as over a first range of output power from a maximum output power to a first power $P_N$ where $P_N$ is greater than zero, driving the load with N stages of the distributed amplifier. Over a second range of output power from $P_N$ to $P_{N-1}$, where $P_{N-1}$ is less than $P_N$, the load is driven with N-1 stages of the distributed amplifier. Over a third range of output power from $P_{N-1}$ to $P_{N-2}$, where $P_{N-2}$ is less than $P_{N-1}$, the load is driven with N-2 stages of the distributed amplifier. Over a fourth range of output power from $P_{N-2}$ to $P_{N-3}$, where $P_{N-3}$ is less than $P_{N-2}$, the load is driven with N-3 stages of the distributed amplifier, and so on. When the final stage is reached, over an $N^{th}$ range of output power from $P_1$ to zero the load is driven with one stage of the distributed amplifier. The N stages of the distributed amplifier are driven with N drive signals that vary as a function of an input signal to be amplified. Preferably, the N drive signals are varied in a manner to maximize conversion efficiency of each operational stage over each range until the final stage.

In another embodiment, a method of operating an N stage distributed amplifier to deliver power to a load is carried out by: over a first range of output power from a maximum output power to a first power $P_N$ where $P_N$ is greater than zero, driving the load with N stages of the distributed amplifier; and over a last range of output power from $P_1$ to zero, driving the load with one stage of the distributed amplifier.

While the present invention can also be used to continuously vary the virtual impedances of the amplifiers for high efficiency, those skilled in the art will appreciate that the principles described herein can also be used for stepped output power control to retain high efficiency at selected lower output powers.

Each of the above exemplary embodiments utilize quarter wavelength transmission lines in a tapered distributed transmission line arrangement interconnecting the stages in the distributed amplifier. Using quarter wavelength inter-stage connection sections provide an advantage of elimination of the phase shifting of the signal through the composite system as the amplitude is varied. As the amplitude of the stages is varied independently the output networks are no longer terminated in their image or characteristic impedance. If the interconnection networks are not multiples of 90 degrees the resulting network undergoes an impedance transformation that is a function of the image parameters as does the termination impedance and the phase shift. For example, a transmission line terminated at both terminals with its characteristic impedance provides an impedance transformation independent of its length in degrees. However, when terminated in an impedance (including real only) other than the characteristic impedance results in impedance transformation that includes a real and reactive component that is a function of the phase length in degrees. There is at least one exception, when the length is a multiple of quarter wavelength and where the impedance transformation of a real load is also real.

A phase shift can be included in the virtual load conditioning provided by the second stage signal variation described above. This can be used to reduce the interconnection component requirements and/or extension of the operating frequency range. This means that interconnection networks with phase shifts other than quarter wavelength multiples can be used with phase and amplitude compensation signals. These compensation signals are determined using the virtual impedance relationships above. Also, although preferred, other embodiments can be devised that do not used the tapered distributed transmission line structure of the exemplary embodiments.

During the range of operation of this conditioned virtual impedance, the output signal voltages and power of the proceeding stages remains constant. This constant signal voltage condition can be used to generate a control loop for adjusting the following stage. However, the stage immediately preceding the final power delivering stage is also expected to maintain a constant output signal voltage while its load impedance is increasing and the output power is decreasing. This means that each stage can use its own output voltage to determine a control signal necessary to maintain a constant output voltage as the output load changes.

Those skilled in the art will understand that the distributed amplifiers depicted herein are depicted as using field effect transistors. However, distributed amplifiers are commonly implemented using other types of transistors including vacuum tubes, bipolar transistors, gallium arsenide devices, MOSFETS, MESFETS, etc. Moreover, the present illustrative examples are shown as single ended amplifiers, but the concepts described herein are equally and equivalently applicable to differential amplifier configurations. Such variations are equivalent and within the scope of the present invention. Additionally, the amplifiers shown herein operate by gradually reducing the output contribution of amplifier stages from the load back. This too should not be considered limiting since the amplifier stages can be controlled in any suitable manner using the principles of the present invention to modulate the load on one or more stages of amplification while reducing the contribution of any stage or stages to the output power without departing from the present invention. Additionally, as previously noted, the transmission lines can be lumped element approximations (for example, lumped element pi networks) or actual transmission lines or combinations thereof, and may or may not be tapered distributed transmission lines, and may or may not be quarter wavelength without departing from the present invention.

Those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

The present invention, as described in embodiments herein, can be implemented using a programmed processor executing programming instructions that are broadly described above and which can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A distributed amplifier, comprising:
   a first amplifier stage having an input;
   a transmission line;
   a second amplifier stage having an input, the second amplifier stage being connected to the first amplifier stage through the transmission line, the transmission line providing an impedance load to the first amplifier stage; and
   a drive circuit that receives an input signal to be amplified and produces a first drive signal and a second drive signal coupled respectively to the first and second inputs, the first and second drive signals being functions of the input signal to be amplified and being unequal in magnitude.

2. The distributed amplifier according to claim 1, wherein the drive circuit generates the first and second drive signals to produce an approximately constant voltage at the connection of the first amplifier stage and the transmission line throughout a range of values of the second drive signal that produce output power ranging from a maximum output power to an output power less than the maximum output power.

3. The distributed amplifier according to claim 1, wherein the drive circuit comprises a processor that compares the input signal to a lookup table to generate the first and second drive signals.

4. The distributed amplifier according to claim 3, wherein the drive circuit quadrature modulates first and second values from the lookup table to produce the first and second drive signals.

5. The distributed amplifier according to claim 1, wherein the drive circuit comprises a processor that receives the input signal and computes first and second input values to first and second signal generators to produce the first and second drive signals.

6. The distributed amplifier according to claim 1, wherein the drive circuit comprises a plurality of circuits having a plurality of transfer functions, each receiving the input signal, and further comprising a circuit that selects a transfer function based upon a value of the input signal for each of the first and second drive signals.

7. The distributed amplifier according to claim 1, wherein the transmission line comprises a tapered distributed transmission line.

8. A distributed amplifier comprising:
   a first amplifier stage having an input:
   a transmission line;
   a second amplifier stage having an input, the second amplifier stage being coupled to the first amplifier stage through the transmission line, the transmission line providing an impedance load to the first amplifier stage;
   a drive circuit that receives an input signal to be amplified and produces a first drive signal and a second drive signal coupled respectively to the first and second inputs, wherein the first and second drive signals are functions of the input signal to be amplified and vary independently in magnitude; and
   wherein the drive circuit generates the first and second drive signals to produce an approximately constant voltage at the junction of the first amplifier stage and the transmission line throughout a range of values of the second drive signal that produce output power ranging from a maximum output power to an output power less than the maximum output power.

9. The distributed amplifier according to claim 8, wherein the transmission line comprises a tapered distributed transmission line.

10. The distributed amplifier according to claim 8, wherein the drive circuit comprises a processor that compares the input signal to a lookup table to generate the first and second drive signals.

11. The distributed amplifier according to claim 8, wherein the drive circuit quadrature modulates first and second values from the lookup table to produce the first and second drive signals.

12. The distributed amplifier according to claim 8, wherein the drive circuit comprises a processor that receives the input signal and computes first and second input values to first and second signal generators to produce the first and second drive signals.

13. The distributed amplifier according to claim 8, wherein the drive circuit comprises a plurality of circuits having a plurality of transfer functions, each receiving the input signal, and further comprising a circuit that selects a transfer function based upon a value of the input signal for each of the first and second drive signals.

14. The distributed amplifier according to claim 8, wherein the drive signal generating circuit generates first and second drive signals to produce an increasing virtual impedance load presented to the first amplifier stage.

15. The distributed amplifier according to claim 8, wherein the first and second drive signals vary in a straight line function.

16. The distributed amplifier according to claim 8, wherein the first and second drive signals vary in a manner to maximize conversion efficiency of the first amplifier stage for input signals varying from a maximum value to a value less than the maximum value.

17. A method of driving a plurality of N inputs to a distributed amplifier circuit, comprising:
    providing an N stage amplifier having N transistors, the amplifier having N−1 transmission line sections coupling N current nodes of the N transistors;
    receiving an input signal $P_{in}(t)$ and producing therefrom N drive signals $S_1(t) \ldots S_N(t)$ wherein the N drive signals are functions of the input signal $P_{in}(t)$ and vary independently in magnitude, such that over a first range of operation:
    $S_N(t)$ produces an output current from transistor N ranging from a maximum current to zero;
    $S_{N-1}(t)$ produces an output current from transistor N−1 that preserves the voltage at node N−1 constant over the range of output current from transistor N; and
    $S_1(t)$ through $S_{N-2}(t)$ produce maximum output current from transistors 1 through N−2.

18. The method according to claim 17, further comprising generating the N drive signals such that over a second range of operation:
    $S_N(t)$ produces an output current from transistor N of zero;
    $S_{N-1}(t)$ produces an output current from transistor N−1 ranging from a current less than maximum to zero;
    $S_{N-2}(t)$ produces an output current from transistor N−2 that preserves the voltage at node N−2 constant over the range of output current from transistor N−1; and
    $S_1(t)$ through $S_{N-3}(t)$ produce maximum output current from transistors 1 through N−3.

19. The method according to claim 18, further comprising generating the N drive signals such that over a third range of operation:
    $S_N(t)$ produces an output current from transistor N of zero;
    $S_{N-1}(t)$ produces an output current from transistor N of zero;
    $S_{N-2}(t)$ produces an output current from transistor N−2 ranging from a current less than maximum to zero;
    $S_{N-3}(t)$ produces an output current from transistor N−3 that preserves the voltage at node N−3 constant over the range of output current from transistor N−2; and
    $S_1(t)$ through $S_{N-4}(t)$ produce maximum output current from transistors 1 through N−4.

20. The method according to claim 17, further comprising generating the N drive signals such that over an $N^{TH}$ range of operation:
    $S_N(t)$ through $S_2(t)$ produces an output current from transistors N through 2 of zero; and
    $S_1(t)$ produces an output current from transistor 1 ranging from a current less than maximum to zero.

21. The method according to claim 17, wherein the N−1 transmission lines comprise tapered distributed transmission lines.

22. A high efficiency distributed amplifier circuit, comprising:
    N stage amplifier having N transistors;
    N−1 transmission line sections coupling N current nodes of the N transistors;
    a drive signal generating circuit that receives an input signal $P_{in}(t)$ and produces N drive signals $S_1(t) \ldots S_N(t)$, Wherein the N drive signals are functions of the input signal $P_{in}(t)$ and vary independently in magnitude, and wherein the amplifier circuit produces an output in the form $P_{out}(t)=GP_{in}(t)$, with G representing the amplifier circuit's power gain;
    wherein the drive signal generating circuit produces the N drive signals such that over a first range of operation:
    $S_N(t)$ produces an output current from transistor N ranging from a maximum current to zero;
    $S_{N-1}(t)$ produces an output current from transistor N−1 that preserves the voltage at node N−1 constant over the range of output current from transistor N; and
    $S_1(t)$ through $S_{N-2}(t)$ produce maximum output current from transistors 1 through N−2.

23. The amplifier according to claim 22, wherein the drive signal generating circuit produces the N drive signals such that over a second range of operation:
    $S_N(t)$ produces an output current from transistor N of zero;
    $S_{N-1}(t)$ produces an output current from transistor N−1 ranging from a current less than maximum to zero;
    $S_{N-2}(t)$ produces an output current from transistor N−2 that preserves the voltage at node N−2 constant over the range of output current from transistor N−1; and
    $S_1(t)$ through $S_{N-3}(t)$ produce maximum output current from transistors 1 through N−3.

24. The amplifier according to claim 22, wherein the drive signal generating circuit produces the N drive signals such that over a third range of operation:
    $S_N(t)$ produces an output current from transistor N of zero;
    $S_{N-2}(t)$ produces an output current from transistor N of zero;
    $S_{N-1}(t)$ produces an output current from transistor N−2 ranging from a current less than maximum to zero;
    $S_{N-3}(t)$ produces an output current from transistor N−3 that preserves the voltage at node N−3 constant over the range of output current from transistor N−2; and
    $S_1(t)$ through $S_{N-4}(t)$ produce maximum output current from transistors 1 through N−4.

25. The amplifier according to claim 22, wherein the drive signal generating circuit produces the N drive signals such that over an $N^{TH}$ range of operation:
    $S_N(t)$ through $S_2(t)$ produces an output current from transistors N through 2 of zero; and S₁(t) produces an output current from transistor 1 ranging from a current less than maximum to zero.

26. The distributed amplifier according to claim 22, wherein the N−1 transmission line sections comprise tapered distributed transmission line sections.

27. The amplifier according to claim 22, wherein the drive signal generating circuit comprises a processor that compares the input signal to a lookup table to obtain N values generate the N drive signals $S_1(t) \ldots S_N(t)$.

28. The amplifier according to claim 27, wherein the drive signal generating circuit quadrature modulates the N values from the lookup table to produce the N drive signals $S_1(t) \ldots S_N(t)$.

29. The amplifier according to claim 22, wherein the drive signal generating circuit comprises a processor that receives the input signal and computes N input values to N signal generators to produce the N drive signals $S_1(t) \ldots S_N(t)$.

30. The amplifier according to claim 22, wherein the drive signal generating circuit comprises a plurality of circuits having a plurality of transfer functions, each receiving the input signal, and further comprising a circuit that selects a transfer function based upon a value of the input signal for each of the N drive signals $S_1(t) \ldots S_N(t)$.

31. A method of driving a distributed amplifier, comprising:
    providing a distributed amplifier having a first stage connected to a second stage through a transmission line, the second stage providing a portion of a virtual impedance load to the first stage;
    receiving an input signal m(t) to be amplified by the distributed amplifier;
    generating a first drive signal that varies as a function of m(t) to drive the first stage:
    generating a second drive signal that varies as a function of m(t) to drive the second stage;
    wherein the first drive signal varies as a function of m(t) from a maximum to zero as m(t) varies from a maximum value to m1; and
    wherein the second drive signal varies as a function of m(t) from a maximum value to zero as m(t) varies from a maximum value to a value m2, where m1 is less than m2.

32. The method according to claim 31, wherein the transmission line comprises a tapered distributed transmission line.

33. The method according to claim 31, wherein the first and second drive signals are generated to produce an increasing virtual impedance load presented to the first stage.

34. The method according to claim 31, wherein the first and second drive signals are generated to produce an increasing virtual impedance load presented to the second stage.

35. The method according to claim 31, wherein the first and second drive signals are generated to produce an increasing virtual impedance load presented to the first and second stages.

36. The method according to claim 31, wherein the first and second drive signals vary in a straight line function.

37. The method according to claim 31, wherein the first and second drive signals vary in a manner to maximize conversion efficiency of the first and second stages from m(t) between its maximum and m2.

38. The method according to claim 31, wherein generating the first and second drive signals comprises comparing the input signal m(t) to a lookup table to generate the first and second drive signals.

39. The method according to claim 38, wherein generating the first and second drive signals comprise quadrature modulating first and second values from the lookup table to produce the first and second drive signals.

40. The method according to claim 31, wherein generating the first and second drive signals comprises receiving the input signal m(t) and computing the first and second input values to first and second signal generators to produce the first and second drive signals.

41. The method according to claim 31, wherein generating the first and second drive signals comprises processing the input signal m(t) with a plurality of circuits having a plurality of transfer functions, and selecting a transfer function based upon a value of the input signal to generate the first and second drive signals.

42. A method of driving a stage of a distributed amplifier, comprising:
    providing a distributed amplifier stage connected to a node in the distributed amplifier, the distributed amplifier stage providing a portion of a virtual impedance load to an other stage of the distributed amplifier at the node;
    receiving an input signal m(t) to be amplified by the distributed amplifier;
    generating a drive signal that varies as a function of m(t) to produce a virtual impedance at the node that increases as m(t) decreases in amplitude, wherein the drive signal varies independently of a drive signal to the other stage of the distributed amplifier.

43. The method according to claim 42, wherein the drive signal is generated to produce an increasing virtual impedance load presented to the other stage.

44. The method according to claim 42, wherein the drive signal varies in a straight line function.

45. The method according to claim 42, wherein the drive signal varies in a manner to maximize conversion efficiency of the other amplifier stage from m(t) between its maximum and m2.

46. The method according to claim 42, wherein generating drive signal comprises comparing the input signal m(t) to a lookup table.

47. The method according to claim 46, wherein generating drive signal comprises quadrature modulating a value from the lookup table to produce the drive signal.

48. The method according to claim 42, wherein generating the drive signal comprises receiving the input signal m(t) and computing an input value to a signal generator to produce the drive signal.

49. The method according to claim 42, wherein generating the drive signal comprises processing the input signal m(t) with plurality of circuits having a plurality of transfer functions, and selecting a transfer function based upon a value of the input signal to generate the drive signal.

50. A method of operating an N stage distributed amplifier to deliver power to a load, comprising:
    driving the N stages of the distributed amplifier with drive signals, each of which vary independently of one another as a function of an amplitude of an input signal to be amplified;
    over a first range of output power from a maximum output power to a first power $P_N$ where $P_N$ is greater than zero, driving the load with the N stages of the distributed amplifier; and
    over a second range of output power from $P_N$ to $P_{N-1}$, where $P_{N-1}$ is less than $P_N$, driving the load with $N_{N-1}$ stages of the distributed amplifier.

51. The method according to claim 50, further comprising:
    over a third range of output power from $P_{N-1}$ to $P_{N-2}$, where $P_{N-2}$ is less than $P_{N-1}$, driving the load with N−2 stages of the distributed amplifier.

52. The method according to claim 51, further comprising:
over a fourth range of output power from $P_{N-2}$ to $P_{N-3}$, where $P_{N-3}$ is less than $P_{N-2}$, driving the load with N–3 stages of the distributed amplifier.

53. The method according to claim 50, further comprising:
over an $N^{th}$ range of output power from $P_1$ to zero, driving the load with one stage of the distributed amplifier.

54. The method according to claim 50, wherein the N drive signals are varied in a manner to maximize conversion efficiency of each of the N amplifier stages over the first range.

55. The method according to claim 54, wherein N–1 drive signals are varied in a manner to maximize conversion efficiency of each of the N–1 amplifier stages over the second range.

56. A method of operating an A stage distributed amplifier to deliver power to a load, comprising:
driving the N stages of the distributed amplifier with or drive signals that vary independently as N coherent functions of an amplitude of an input signal to be amplified;
over a first range of output power from a maximum output power to a first power $P_N$ where $P_N$ is greater than zero, driving the load with N stages of the distributed amplifier; and
over a last range of output power from $P_1$ to zero driving the load with one stage of the distributed amplifier.

57. The method according to claim 56, further comprising:
over a second range of output power from $P_N$ to $P_{N-1}$, where $P_{N-1}$ is less than $P_N$, driving the load with N–1 stages of the distributed amplifier.

58. The method according to claim 56, wherein the N drive signals are varied in a manner to maximize conversion efficiency of each of the N amplifier stages over the first range.

59. The method according to claim 56, wherein over the last range of operation, the drive signal to the one stage of the distributed amplifier is varied from a value that produces power $P_1$ to a value that produces zero power.

* * * * *